(12) United States Patent
Kawasaki

(10) Patent No.: US 12,176,886 B2
(45) Date of Patent: Dec. 24, 2024

(54) HIGH-FREQUENCY APPARATUS

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 167 days.

(21) Appl. No.: 17/940,296

(22) Filed: Sep. 8, 2022

(65) Prior Publication Data

US 2023/0006650 A1   Jan. 5, 2023

Related U.S. Application Data

(63) Continuation of application No. 16/898,591, filed on Jun. 11, 2020, now Pat. No. 11,482,987, which is a (Continued)

(30) Foreign Application Priority Data

Dec. 25, 2017 (JP) ................................. 2017-248246

(51) Int. Cl.
*H03H 9/64* (2006.01)
*H03H 9/02* (2006.01)
(Continued)

(52) U.S. Cl.
CPC ...... *H03H 9/6483* (2013.01); *H03H 9/02559* (2013.01); *H03H 9/0523* (2013.01);
(Continued)

(58) Field of Classification Search
CPC ............. H03H 9/6483; H03H 9/02559; H03H 9/0523; H03H 9/0542; H03H 9/059; H03H 9/205; H03H 9/25; H04B 1/40
(Continued)

(56) References Cited

U.S. PATENT DOCUMENTS 11,482,987 B2 * 10/2022 Kawasaki .......... H03H 9/02559
2012/0181898 A1 * 7/2012 Hatakeyama ............ H03H 3/08
310/313 B

FOREIGN PATENT DOCUMENTS

CN 107039406 A 8/2017
JP 3879923 B2 * 2/2007

OTHER PUBLICATIONS

"Lithium Niobate-Based Heterostructures", IOP publishing Chapter 1, pp. 1-3, par. 3, Copyright © IOP Publishing Ltd 2018 (Year: 2018).*

(Continued)

*Primary Examiner* — Hafizur Rahman
(74) *Attorney, Agent, or Firm* — Keating & Bennett, LLP

(57) ABSTRACT

A high-frequency apparatus includes a resin substrate, a first device including a substrate and provided on the resin substrate, and a second device provided adjacent to the first device on the resin substrate. Each of the first device and the second device includes an acoustic wave device. The second device includes a piezoelectric substrate and a functional element provided on the piezoelectric substrate. The substrate of the first device includes Si or a laminated material including Si. The piezoelectric substrate of the second device includes $LiTaO_3$, $LiNbO_3$, or a laminated material including $LiTaO_3$ or $LiNbO_3$. The resin substrate includes glass.

23 Claims, 8 Drawing Sheets

Related U.S. Application Data continuation of application No. PCT/JP2018/042639, filed on Nov. 19, 2018.

(51) Int. Cl.
 *H03H 9/05* (2006.01)
 *H03H 9/205* (2006.01)
 *H03H 9/25* (2006.01)
 *H04B 1/40* (2015.01)

(52) U.S. Cl.
 CPC .......... *H03H 9/0542* (2013.01); *H03H 9/059* (2013.01); *H03H 9/205* (2013.01); *H03H 9/25* (2013.01); *H04B 1/40* (2013.01)

(58) Field of Classification Search
 USPC .......................................................... 455/73
 See application file for complete search history.

(56) References Cited

OTHER PUBLICATIONS

First Office Action in CN201880083456.5, mailed Jan. 31, 2023, 8 pages.
Kawasaki, "High-Frequency Apparatus", U.S. Appl. No. 16/898,591, filed Jun. 11, 2020.

* cited by examiner

DISTORTION IS CANCELED OUT

FIG.11
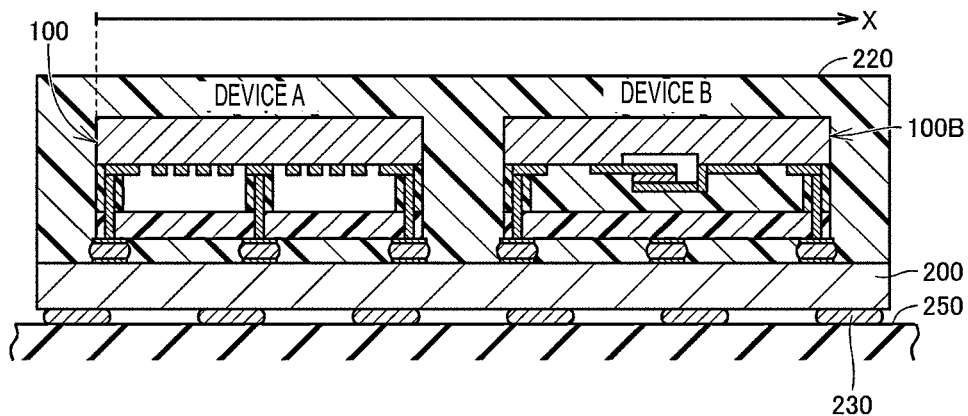
FIG.12
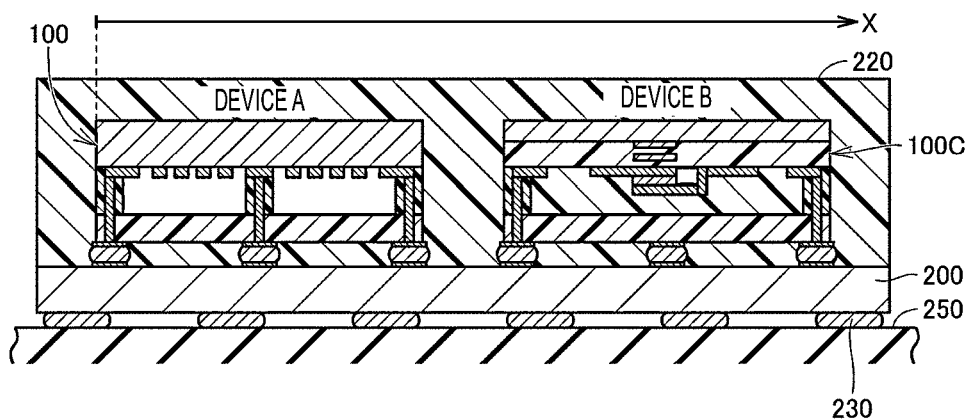
FIG.13
|  |  | CHIP MATERIAL/COVER MATERIAL | | DISTORTION AMOUNT ($\varepsilon$) | |
|---|---|---|---|---|---|
|  |  | DEVICE A | DEVICE B | DEVICE A | DEVICE B |
| COMPARATIVE EXAMPLE | 1 | LiNbO$_3$/RESIN | LiNbO$_3$/RESIN | $9.837 \times 10^{-5}$ | $9.746 \times 10^{-5}$ |
|  | 2 | Si/RESIN | Si/RESIN | $-1.429 \times 10^{-4}$ | $-1.453 \times 10^{-4}$ |
|  | 3 | Si/Si | Si/Si | $-1.719 \times 10^{-4}$ | $-1.744 \times 10^{-4}$ |
| WORKING EXAMPLE | 1 | LiNbO$_3$/RESIN | Si/RESIN | $6.584 \times 10^{-5}$ | $-1.070 \times 10^{-4}$ |
|  | 2 | LiNbO$_3$/RESIN | Si/Si | $6.866 \times 10^{-5}$ | $-1.476 \times 10^{-4}$ |

FIG.14
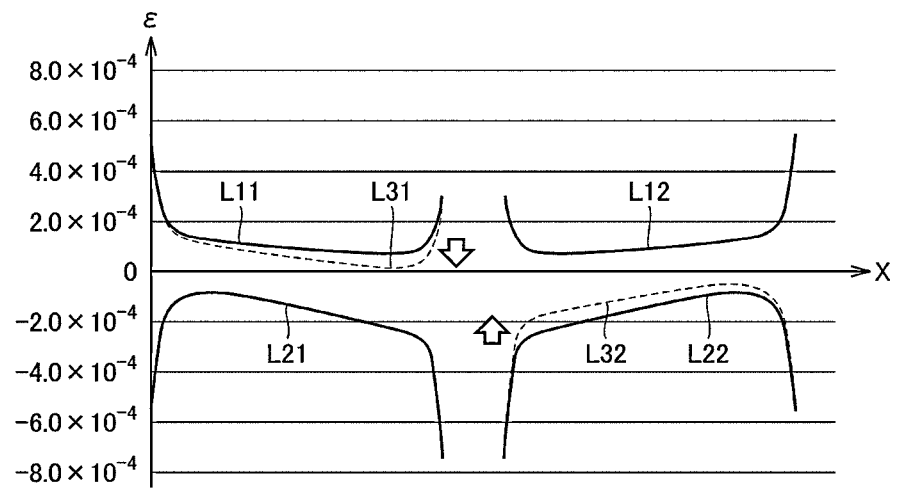
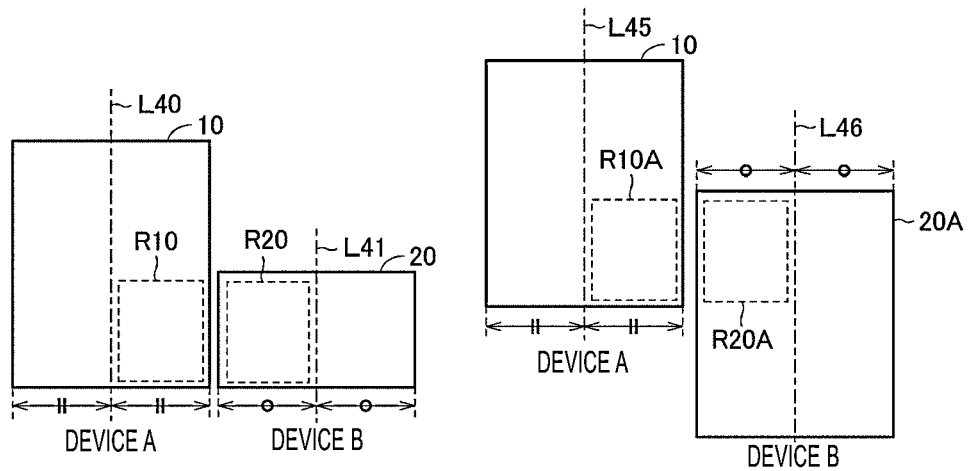
FIG. 15A  FIG. 15B

HIGH-FREQUENCY APPARATUS

CROSS REFERENCE TO RELATED APPLICATIONS

This application claims the benefit of priority to Japanese Patent Application No. 2017-248246 filed on Dec. 25, 2017 and is a Continuation Applications of U.S. patent application Ser. No. 16/898,591, filed on Jun. 11, 2020 which is a Continuation Applications of PCT Application No. PCT/JP2018/042639 filed on Nov. 19, 2018. The entire contents of each application are hereby incorporated herein by reference.

BACKGROUND OF THE INVENTION

1. Field of the Invention

The present disclosure relates to a high-frequency apparatus, and more particularly relates to a technology to mount an acoustic wave device in a high-frequency apparatus in which a plurality of acoustic wave devices is mounted.

2. Description of the Related Art

In electronic apparatuses such as a mobile phone, a smartphone, or the like, an acoustic wave device using a Surface Acoustic Wave (SAW) resonator or a bulk wave (BAW: Bulk Acoustic Wave) resonator has been used. In recent years, reduction of electronic apparatuses in size and thickness has been advanced, and there is a demand for reducing the acoustic wave device itself in size and height in accordance therewith.

In order to meet such a demand, a WLP (Wafer Level Package) structure in which a chip itself of the acoustic wave device is used as a package has been proposed. An acoustic wave device having a typical WLP structure has a configuration in which, in a hollow space formed by a piezoelectric substrate, a support layer arranged in the periphery of the surface of the piezoelectric substrate, and a cover portion provided on the support layer, a plurality of functional elements are arranged on the piezoelectric substrate. In a case of a surface acoustic wave (SAW) device, a comb tooth-shaped electrode (IDT: Inter Digital Transducer) is arranged as a functional element.

Furthermore, forming as a high-frequency module in which a plurality of acoustic wave devices is mounted on one substrate has also been proposed. For example, Japanese Unexamined Patent Application Publication No. 2003-51733 discloses a high-frequency module in which at least two surface acoustic wave devices are flip-chip mounted on a mounting substrate.

When mounting an acoustic wave device having such a WLP structure on a mounting substrate, there is a case where a method (reflow) for electrically connecting the acoustic wave device and the mounting substrate by using solder is employed. In this case, by heating the acoustic wave device and the mounting substrate at high temperature to a temperature at which the solder is melted (being in a non-stress state), and then cooling them to normal temperature, the conductors of the acoustic wave device and the mounting substrate are electrically connected to each other with a solder bump.

The piezoelectric substrate of the acoustic wave device is formed of, for example, a piezoelectric single crystal material such as lithium tantalate ($LiTaO_3$), lithium niobate ($LiNbO_3$), alumina, silicon (Si), and sapphire, or a piezoelectric laminated material made of $LiTaO_3$ or $LiNbO_3$. On the other hand, the mounting substrate is formed of a resin such as phenol, epoxy, or the like. Therefore, in many cases, the piezoelectric substrate of the acoustic wave device and the mounting substrate have different coefficients of linear expansion. As a result, when cooling in the reflow process, mechanical distortion occurs in the acoustic wave device itself due to a difference in the coefficient of linear expansion between the piezoelectric substrate and the mounting substrate, and characteristics of the acoustic wave device may vary.

In particular, when the acoustic wave device and another device are mounted on one substrate, the distortion may further increase depending on the coefficients of linear expansion of the piezoelectric substrate of the acoustic wave device and the substrate included in the other device, and influence on the characteristics of the acoustic wave device may increase.

SUMMARY OF THE INVENTION

Preferred embodiments of the present invention provide high-frequency apparatuses in each of which an acoustic wave device and another device are mounted on a mounting substrate, and significantly reduce or prevent deterioration in characteristics of the acoustic wave device due to distortion in the mounting process.

A high-frequency apparatus according to a preferred embodiment of the present invention includes a resin substrate, a first device including a substrate and provided on the resin substrate, and a second device provided adjacent to the first device on the resin substrate. Each of the first device and the second device includes an acoustic wave device. The second device includes a piezoelectric substrate and a functional element provided on the piezoelectric substrate. The substrate of the first device includes Si or a laminated material including Si. The piezoelectric substrate of the second device includes $LiTaO_3$, $LiNbO_3$, or a laminated material including $LiTaO_3$ or $LiNbO_3$. The resin substrate includes glass.

The substrate of the first device may preferably be made of Si.

The first device may preferably be a bulk acoustic wave resonator.

The piezoelectric substrate of the second device may preferably be made of $LiNbO_3$.

The first device may preferably be a surface acoustic wave resonator.

In a preferred embodiment of the present invention, a shortest distance between the first and second devices is less than a width of the first device or a minimum width of the second device.

In a preferred embodiment of the present invention, in a plan view, the first and second devices each have a rectangular shape and a longer side of the first device is adjacent to a longer side of the second device.

In a preferred embodiment of the present invention, a resin material of the resin substrate includes epoxy or phenol.

In a preferred embodiment of the present invention, a height of the first device is the same or substantially the same as a height of the second device.

In a preferred embodiment of the present invention, each of the first and second devices includes a support portion and cover portion.

In a preferred embodiment of the present invention, the cover portion of the first device is Si.

In another preferred embodiment of the present invention, the cover portion of the first device is resin.

In a preferred embodiment of the present invention, the substrate of the first device is thicker than the cover portion of the first device, and the piezoelectric substrate of the second device is thicker than the cover portion of the second device.

In a preferred embodiment of the present invention, in the second device, a ladder filter including a serial arm resonator, a parallel arm resonator, and an inductor electrically connected in series or in parallel to the parallel arm resonator is provided, and the parallel arm resonator is provided between adjacent sides adjacent to each other of the first device and the second device adjacent to each other and an imaginary line that passes through a center of the second device and is parallel or substantially parallel to the adjacent sides.

In another preferred embodiment of the present invention, in the second device, a ladder filter including serial arm resonators, parallel arm resonators, and an inductor electrically connected in series or in parallel to the parallel arm resonators is provided and at least one of a resonator which defines an upper limit frequency of a pass band of the filter among the serial arm resonators, and a resonator which defines a lower limit frequency of the pass band of the filter among the parallel arm resonators is provided between adjacent sides adjacent to each other of the first device and the second device adjacent to each other and an imaginary line that passes through a center of the second device and is parallel or substantially parallel to the adjacent sides.

In a preferred embodiment of the present invention, a plurality of the functional elements are provided on a main surface of the piezoelectric substrate, and the second device further includes a support portion provided in a periphery of a region in which the plurality of functional elements is provided, and a cover portion that faces a main surface of the piezoelectric substrate.

In a preferred embodiment of the present invention, a via is provided through the support portion, and the via is electrically connected to a wiring pattern provided on a main surface of the piezoelectric substrate.

In a preferred embodiment of the present invention, a wiring pattern provided on a main surface of the piezoelectric substrate is electrically connected to a wiring pattern provided on a surface of the resin substrate by a conductive portion.

In a preferred embodiment of the present invention, a coefficient of linear expansion of the piezoelectric substrate of the second device is about 16 ppm/° C. and a coefficient of linear expansion of the resin substrate is between about 8 ppm/° C. and about 14 ppm/° C.

In a preferred embodiment of the present invention, the first device is an FBAR (Film Bulk Acoustic Resonator) bulk acoustic wave resonator.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 11 is a diagram showing a second example of the high-frequency apparatus in a simulation of the first working example.

FIG. 12 is a diagram showing a third example of the high-frequency apparatus in a simulation of the first working example.

FIG. 13 is a diagram showing simulation results.

FIG. 14 is a graph showing the simulation results.

FIGS. 15A and 15B include diagrams showing a region where distortion is significantly improved.

DETAILED DESCRIPTION OF THE PREFERRED EMBODIMENTS

Figure 1:
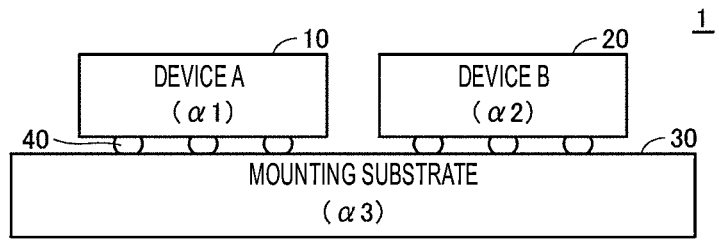
FIG. 1 is a diagram of an acoustic wave device in a high-frequency apparatus according to a first preferred embodiment of the present invention.

Hereinafter, preferred embodiments of the present invention will be described in detail with reference to the drawings. Note that identical or corresponding elements in the drawings will be denoted by the same reference numerals and descriptions thereof will not be repeated.

First Preferred Embodiment

FIG. 1 is a diagram of devices in a high-frequency apparatus 1 according to a first preferred embodiment of the present invention. Referring to FIG. 1, the high-frequency apparatus 1 includes a device 10 (device A), a device 20 (device B), and a mounting substrate 30. The two devices 10 and 20 are electrically connected onto the mounting substrate 30 with solder bumps 40 provided therebetween. At least one of the devices 10 and 20 is an acoustic wave device including a piezoelectric substrate and a plurality of functional elements.

Here, a coefficient of linear expansion of a substrate included in the device 10 is taken as α1, a coefficient of linear expansion of a substrate of the device 20 is taken as α2, and a coefficient of linear expansion of the mounting substrate 30 is taken as α3.

In general, when a device, for example, the devices 10 and 20, is mounted on the mounting substrate 30, mounting is performed through a reflow process in many cases. In the reflow process, the solder 40 is applied onto the mounting substrate 30 by printing or the like in advance, and the devices 10 and 20 are provided thereon. After that, by heating to high temperature in this state, melting the solder, and then cooling, the mounting substrate 30 and the devices 10 and 20 are coupled to each other. At this time, distortion may occur in the mounting substrate 30 due to a difference between the coefficient of linear expansion of the substrate included in each of the devices 10 and 20 and the coefficient of linear expansion of the mounting substrate 30. This distortion may cause mechanical deformation of the functional elements of the acoustic wave device of the devices 10 and 20, and characteristics of the acoustic wave device are changed.

Figure 2:
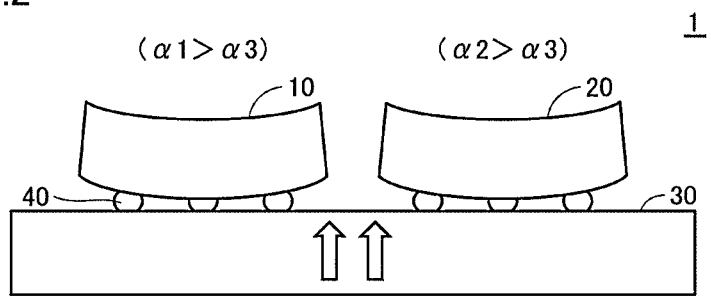
FIG. 2 is a first diagram showing distortion of a mounting substrate caused by a difference in a coefficient of linear expansion.
Figure 3:
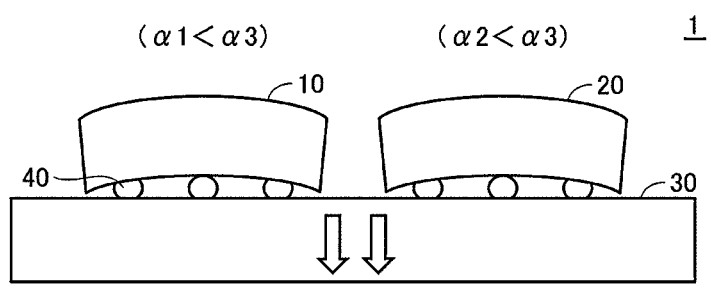
FIG. 3 is a second diagram showing the distortion of the mounting substrate caused by the difference in the coefficient of linear expansion.
Figure 4:
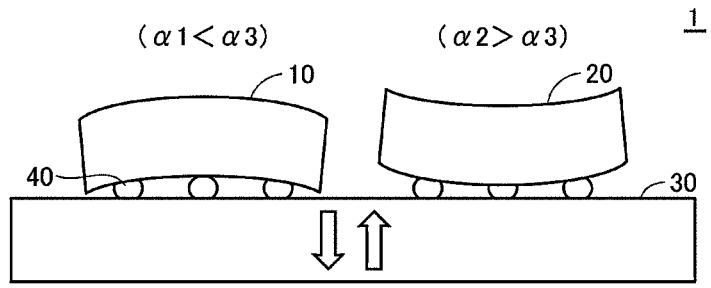
FIG. 4 is a third diagram showing the distortion of the mounting substrate caused by the difference in the coefficient of linear expansion.

FIG. 2 to FIG. 4 are diagrams showing distortion of the mounting substrate 30 caused by the difference in the coefficient of linear expansion.

FIG. 2 shows an example in a case where the coefficient α1 of linear expansion of the substrate of the device 10 and the coefficient α2 of linear expansion of the substrate of the device 20 are both higher than the coefficient α3 of linear expansion of the mounting substrate 30 (α1>α3, α2>α3).

In the heating process in the reflow, since the devices 10 and 20 each have a higher coefficient of linear expansion than that of the mounting substrate 30, the devices 10 and 20 extend more than the mounting substrate 30 in the heating state. The solder 40 solidifies in the middle of the cooling step and the devices 10 and 20 is fixed to the mounting substrate 30, but when the temperature is further decreased to normal temperature, the devices 10 and 20 contract more than the mounting substrate 30. Then, as shown in FIG. 2, the devices 10 and 20 may be deformed in a convex shape toward the mounting substrate 30 side. This causes distortion in portions of the mounting substrate 30 facing end portions of the devices 10 and 20 in a direction from the mounting substrate 30 toward the devices 10 and 20, which may cause a decrease in the characteristics of the devices 10 and 20.

In contrast, when the coefficient of linear expansion of the substrate of each of the devices 10 and 20 is lower than the coefficient of linear expansion of the mounting substrate 30 (α1<α3, α2<α3), since a contraction amount of the mounting substrate 30 after the solidification of the solder in the cooling step becomes larger than a contraction amount of the devices 10 and 20, distortion occurs in the mounting substrate 30 in a direction from the devices 10 and 20 toward the mounting substrate 30 as shown in FIG. 3.

Accordingly, the first preferred embodiment includes a substrate having a lower coefficient of linear expansion than that of the mounting substrate 30 as a substrate of one device, and a substrate having a higher coefficient of linear expansion than that of the mounting substrate 30 as a substrate of the other device (for example, α1<α3<α2). Thus, as shown in FIG. 4, in the mounting substrate 30, the distortion caused by the difference in the coefficient of linear expansion from the substrate of the device 10 and the distortion caused by the difference in the coefficient of linear expansion from the substrate of the device 20 are generated in reverse directions to each other. Accordingly, at a portion where the device 10 and the device 20 are adjacent to or in a vicinity of each other, at least a portion of the distortions is canceled out, and the deformation of the mounting substrate 30 is reduced or prevented. As a result, the deformation of the devices 10 and 20 is significantly reduced or prevented, and thus a decrease in the characteristics of the acoustic wave device included in the devices 10 and 20 is able to significantly reduced or prevented.

Hereinafter, the features of the first preferred embodiment will be described.

FIG. 5 to FIG. 8 are examples of cross-sectional views in states in which acoustic wave devices 100, 100A to 100C included in the first preferred embodiment are mounted on a mounting substrate 200. The acoustic wave devices 100, 100A to 100C correspond to the device 10 or the device 20 shown in FIG. 1, and the mounting substrate 200 corresponds to the mounting substrate 30 in FIG. 1.

Figure 5:
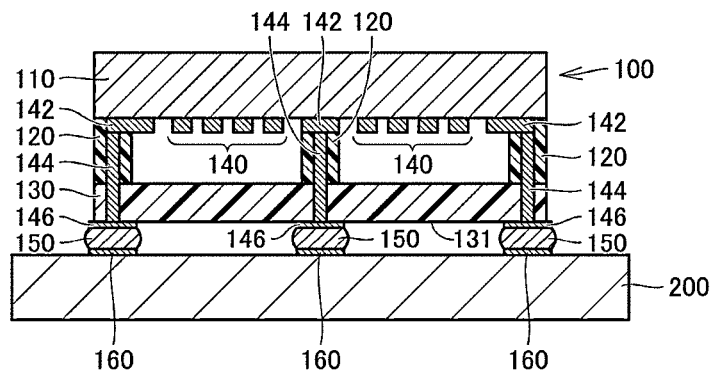
FIG. 5 is a diagram showing a first example of the acoustic wave device.

Referring to FIG. 5, the acoustic wave device 100 includes a piezoelectric substrate 110, a support portion 120, a cover portion 130, a functional element 140, and a connection terminal 150.

The piezoelectric substrate 110 is preferably made of, for example, a piezoelectric single crystal material of LiTaO$_3$ or LiNbO$_3$, or a piezoelectric laminated material thereof. On one main surface of the piezoelectric substrate 110, a plurality of the functional elements 140 is provided. The functional element 140 includes, for example, a pair of IDT electrodes defined by an electrode material, such as a single metal including at least one of aluminum, copper, silver, gold, titanium, tungsten, platinum, chromium, nickel, and molybdenum, an alloy including these metals as a main component, or the like. A surface acoustic wave resonator is defined by the piezoelectric substrate 110 and the IDT electrode.

On the piezoelectric substrate 110, the support portion 120 preferably made of, for example, a resin is provided in the periphery of a region in which the functional elements 140 are located. Because the cover portion 130 faces the main surface of the piezoelectric substrate 110 on which the functional elements 140 are provided with the support portion 120 interposed therebetween, a hollow space is provided in the periphery of the plurality of functional elements 140 including the IDT electrode. Accordingly, a surface acoustic wave propagates in a portion adjacent to or in a vicinity of the hollow space of the piezoelectric substrate 110.

A wiring pattern 142 to electrically connect the functional elements 140 is provided on the main surface of the piezoelectric substrate 110. The wiring pattern 142 is electrically connected to a conductive portion 146 provided on a surface 131 of the cover portion 130 with a through-electrode (via) 144 penetrating through the support portion 120 and the cover portion 130 provided therebetween. The conductive portion 146 is electrically connected to a wiring pattern 160 on the mounting substrate 200 with the connection terminal 150, for example, a solder bump provided therebetween.

A coefficient of linear expansion of the piezoelectric substrate 110 in a main surface direction (a propagation direction of the surface acoustic wave in a case of SAW) is preferably about 16 ppm/° C., for example. The support portion 120 and the cover portion 130 are made of a resin including, for example, epoxy, polyimide, acrylic, urethane, or the like as a main component. For the support portion 120 and the cover portion 130, a metal may be partially included in addition to the resin described above. Furthermore, the mounting substrate 200 is a PCB substrate including, for example, glass epoxy including copper, and a coefficient of linear expansion in a main surface direction is preferably about 8 ppm/° C. to about 14 ppm/° C., for example. Note that the mounting substrate 200 may be a multilayer substrate in which a plurality of layers is laminated. Accordingly, the coefficient of linear expansion of the acoustic wave device 100 is higher than the coefficient of linear expansion of the mounting substrate 200.

Figure 6:
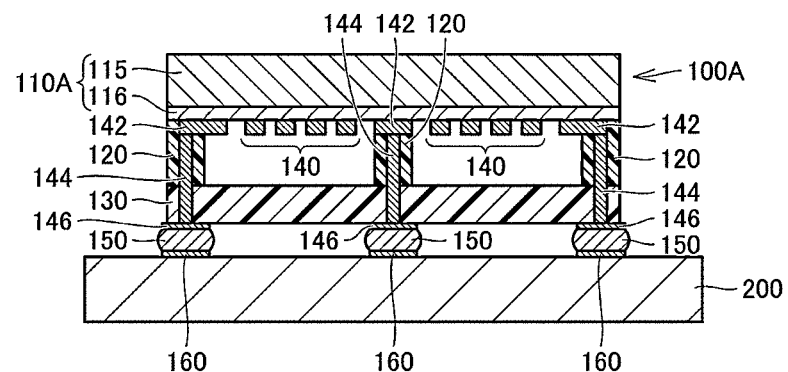
FIG. 6 is a diagram showing a second example of the acoustic wave device.

Referring to FIG. 6, in the acoustic wave device 100A, the piezoelectric substrate 110 of the acoustic wave device 100 in FIG. 5 is replaced with a piezoelectric substrate 110A, and the other portions are the same as or similar to those of the acoustic wave device 100.

Figure 7:
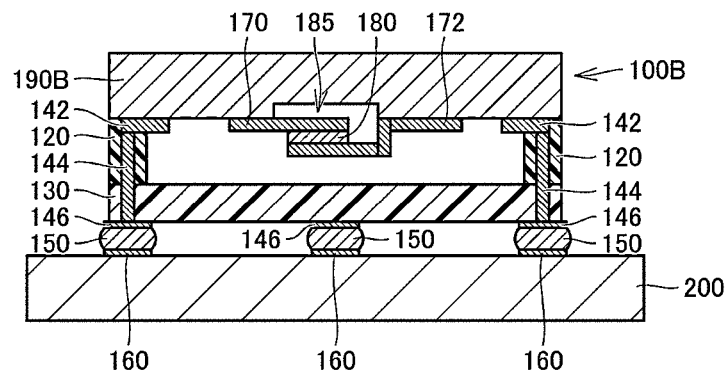
FIG. 7 is a diagram showing a third example of the acoustic wave device.
Figure 8:
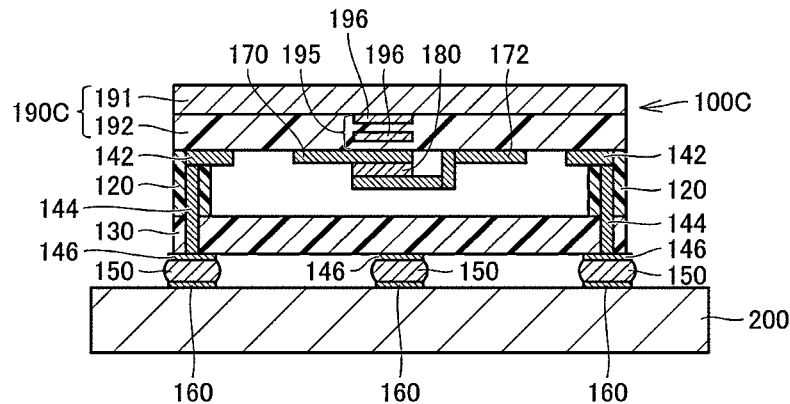
FIG. 8 is a diagram showing a fourth example of the acoustic wave device.

The piezoelectric substrate 110A is provided, for example, by laminating an Si-based first layer 115 and a thin LiTaO$_3$ based second layer 116. Note that the functional elements 140 are provided on the second layer 116. FIG. 7 and FIG. 8 each show an example in a case where a BAW is included as the acoustic wave device. The acoustic wave device 100B shown in FIG. 7 is an FBAR (Film Bulk Acoustic Resonator) BAW. The FBAR BAW includes a resonator defined by a piezoelectric film 180 sandwiched between two electrodes 170 and 172 that is provided in a cavity 185 provided in an Si-based support substrate 190B. By providing the resonator in the cavity 185, the resonator is able to vibrate without being affected by the support substrate 190B.

As the electrodes 170 and 172 defining the resonator, for example, molybdenum is preferably used. Furthermore, as the piezoelectric film 180, for example, aluminum nitride (AlN) is preferably used.

The acoustic wave device 100C shown in FIG. 8 is an SMR (Solidly-Mounted Resonator) BAW. A support substrate 190C of the SMR type BAW is provided, for example, by laminating a Si-based first layer 191 and a second layer 192 including an insulator. A resonator defined by the two electrodes 170 and 172 and the piezoelectric film 180 is provided on the second layer 192. A cavity as in the FBAR BAW is not provided in the portion of the second layer 192 where the resonator is provided, but an acoustic mirror 195 is provided inside the second layer 192 instead.

The acoustic mirror 195 includes a low acoustic impedance layer and a high acoustic impedance layer each having a thickness of, for example, about ¼ of a wave length of a signal to be passed that are alternately laminated. In FIG. 8, the low acoustic impedance layer is an insulator that defines the second layer 192, and for example, SiO$_2$ is preferably used. Furthermore, the high acoustic impedance layer is an electrode 196 provided inside the second layer 192, and for example, tungsten (W) or the like is preferably used as the electrode 196. By causing the acoustic mirror 195 to reflect an acoustic wave generated in the resonator, the acoustic wave is prevented from leaking to the support substrate 190C.

Since the coefficient of linear expansion of Si is about 3 ppm/° C., for example, the acoustic wave device 100A has a lower coefficient of linear expansion than that of the mounting substrate 200. Note that in the case of the BAW as in the acoustic wave devices 100B and 100C as well, since Si is used for the support substrate, the coefficient of linear expansion of the support substrate in a main surface direction is about 3 ppm/° C., for example. Therefore, coefficients of linear expansion of the acoustic wave devices 100B and 100C are also lower than the coefficient of linear expansion of the mounting substrate 200.

FIG. 9 to FIG. 14 are diagrams showing simulations each performed on a distortion amount generated in the reflow process in a case where the acoustic wave devices as shown in FIG. 5 to FIG. 8 described above are adjacent to or in a vicinity of each other on the mounting substrate.

Figure 9:
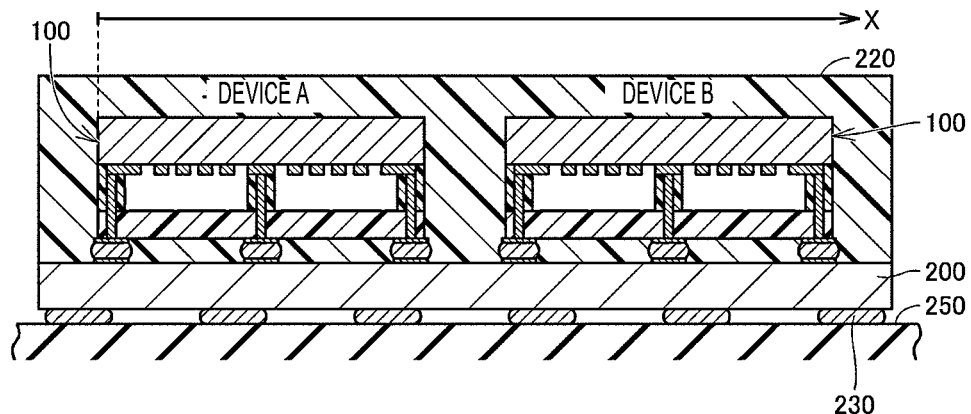
FIG. 9 is a diagram showing the high-frequency apparatus in a simulation of a first comparative example.
Figure 10:
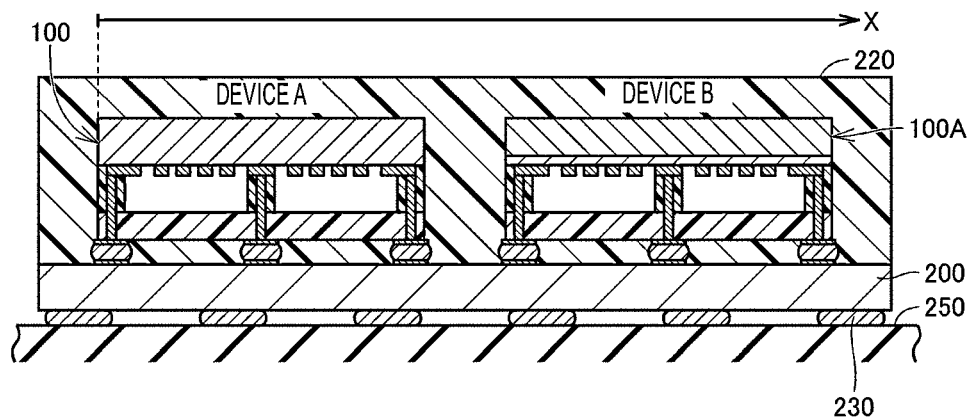
FIG. 10 is a diagram showing a first example of the high-frequency apparatus in a simulation of a first working example.

The simulation was performed in a state in which, as shown in FIG. 9, two acoustic wave devices were adjacent to or in a vicinity of each other on the common mounting substrate 200 provided on a board substrate 250, and the acoustic wave devices and the mounting substrate 200 were molded with a mold resin 220. Note that the acoustic wave device on the left side was taken as the device A and the acoustic wave device on the right side was taken as the device B in FIG. 9, and a distance in a direction from the left end of the device A toward the device B was taken as X. Furthermore, in FIG. 9, distortion ($\varepsilon$) in the X direction of a device surface (the surface on which the IDT is present) at the distance X was calculated, a tensile direction was taken as a positive direction, and a compression direction was taken as a negative direction.

In the simulation, as comparative examples in each of which acoustic wave devices of the same or similar type are provided adjacent to or in a vicinity of each other, the simulations were performed for a case where the acoustic wave devices 100 in FIG. 5 were adjacent to or in a vicinity of each other (first comparative example: corresponding to FIG. 9), for a case where the acoustic wave devices 100A in FIG. 6 were adjacent to or in a vicinity of each other (second comparative example), and for a case where acoustic wave devices in each of which Si was included also for the cover portion in addition to the piezoelectric substrate are adjacent to or in a vicinity of each other (third comparative example). Furthermore, as working examples, the simulations were performed for a case where the acoustic wave device 100 in FIG. 5 was included for the device A and the acoustic wave device 100A in FIG. 6 was included for the device B (first working example: corresponding to FIG. 10), and for a case where the acoustic wave device of the third comparative example was included for the device B (second working example). Here, "adjacent" indicates that a component or a surface wiring is not provided between the two acoustic wave devices on the common mounting substrate 200.

Note that as a modification of the first working example, the BAW may be used as the device B. Specifically, a case where the acoustic wave device 100 in FIG. 5 is used for the device A and the acoustic wave device 100B in FIG. 7 is used for the device B (FIG. 11) and a case where the acoustic wave device 100 in FIG. 5 is used for the device A and the acoustic wave device 100C in FIG. 8 is used for the device B (FIG. 12) are described.

FIG. 13 is a diagram showing the results of the simulations described above. In FIG. 13, in the first comparative example in which the acoustic wave devices 100 including LiTaO$_3$ having the coefficient of linear expansion higher than that of the mounting substrate 200 were combined as the device A and the device B, as shown in FIG. 13, a distortion amount at a portion where the acoustic wave devices are adjacent is about $9.8 \times 10^{-5}$. Furthermore, in the case of the second comparative example in which the acoustic wave devices 100A were included for both of the acoustic wave devices, in each of which Si was included for the piezoelectric substrate and the resin was included for the cover portion 130, the distortion amount is about $-1.4 \times 10^{-4}$. In the case of the third comparative example of the acoustic wave devices in each of which Si was included for the piezoelectric substrate and the cover portion 130, the distortion amount is about $-1.7 \times 10^{-4}$.

On the other hand, in the first working example in which the acoustic wave device 100 in which LiTaO$_3$ was included was provided as the device A, and the acoustic wave device 100A in which Si was included for the piezoelectric substrate and the resin was included for the cover portion 130 was provided as the device B, the distortion amount of the device A is about $6.6 \times 10^{-5}$, which is reduced to about $\frac{2}{3}$, and the distortion amount of the device B is about $-1.0 \times 10^{-4}$, which is reduced to about $\frac{3}{4}$.

Furthermore, in the case where the acoustic wave device in which Si was included for the piezoelectric substrate and the cover portion 130 was provided for the device B, the distortion amount is about $-1.5 \times 10^{-4}$, and a reduction of about 15% is achieved.

FIG. 14 is a graph obtained by plotting the profile of the distortion amount in each of the case of the first comparative example (lines L11 and L12), the case of the second comparative example (lines L21 and L22), and the case of the first working example (lines L31 and L32), among the simulations shown in FIG. 13. Also as shown in FIG. 14, by providing the acoustic wave device having a higher coefficient of linear expansion than that of the mounting substrate and the acoustic wave device having a lower coefficient of linear expansion than that of the mounting substrate be adjacent to or in a vicinity of each other, the distortion amount at a portion where the two acoustic wave devices are adjacent to or in a vicinity of each other is reduced. Note that in each acoustic wave device, since the improved distortion amount on the opposite side to the side on which the devices are adjacent is very small, a large improvement amount is preferably provided, for example, at the portion where the acoustic wave devices are adjacent to or in a vicinity of each other.

As described above, also in the simulation, it has been shown that, by providing the acoustic wave device having the coefficient of linear expansion higher than that of the mounting substrate adjacent to or in a vicinity of the acoustic wave device having the coefficient of linear expansion lower than that of the mounting substrate, the distortion amount of the mounting substrate in the portion where the devices are adjacent is reduced. Accordingly, in each acoustic wave device, a decrease in the characteristics of the acoustic wave device is able to significantly reduced or prevented by providing the functional element that has large influence on the characteristics of the acoustic wave device due to the distortion of the mounting substrate at the position where the distortion is reduced as described above.

Specifically, as shown in FIGS. 15A and 15B, for each acoustic wave device, the functional element that has a large influence on the characteristics of the acoustic wave device is preferably provided, for example, in regions (hereinafter, each also referred to as an "improvement region") between adjacent sides adjacent to each other and imaginary lines that pass through the centers of the respective acoustic wave devices and are parallel or substantially parallel to the adjacent sides, respectively.

In an example of FIG. 15A, a region R10 between the adjacent side and an imaginary line L40 in the device A, and a region R20 between the adjacent side and an imaginary line L41 in the device B each correspond to the above-described improvement region. Furthermore, in an example of FIG. 15B, a region R10A between the adjacent side and an imaginary line L45 in the device A, and a region R20A between the adjacent side and an imaginary line L46 in the device B each correspond to the above-described improvement region.

Hereinafter, in second to fifth preferred embodiments, an example of a functional element that is preferably provided in the improvement region will be described.

Second Preferred Embodiment

In a second preferred embodiment of the present invention, an example in a case where the acoustic wave device has a ladder filter including a parallel arm resonator to which an inductor is electrically connected will be described.

Figure 16:
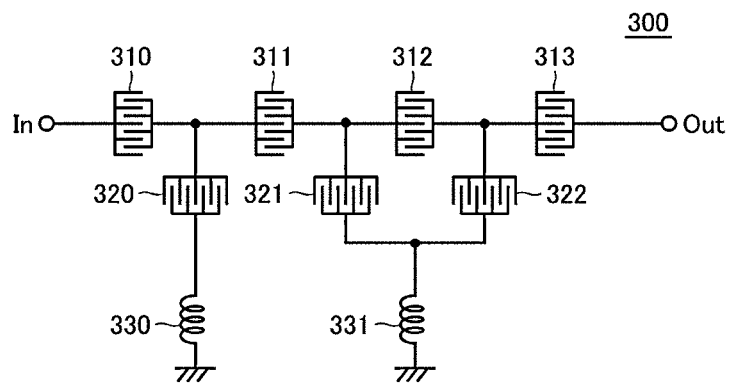
FIG. 16 is a diagram showing an example of a ladder filter according to a second preferred embodiment of the present invention.

FIG. 16 is a diagram showing an example of a ladder filter 300 according to the second preferred embodiment. Referring to FIG. 16, the ladder filter 300 includes serial arm resonators 310 to 313 electrically connected in series between an input terminal In and an output terminal Out, and parallel arm resonators 320 to 322 each electrically connected between a connection node between the serial arm resonators and a ground node.

One end of the parallel arm resonator 320 is electrically connected to the connection node between the serial arm resonator 310 and the serial arm resonator 311, and the other end thereof is electrically connected to the ground node with an inductor 330 interposed therebetween. One end of the parallel arm resonator 321 is electrically connected to the connection node between the serial arm resonator 311 and the serial arm resonator 312, and the other end thereof is electrically connected to the ground node with an inductor 331 interposed therebetween. One end of the parallel arm resonator 322 is electrically connected to the connection node between the serial arm resonator 312 and the serial arm resonator 313, and the other end thereof is electrically connected to the ground node with the inductor 331 interposed therebetween, similar to the parallel arm resonator 321.

In the ladder filter 300 as described above, a frequency of an attenuation pole defining a passage range of the filter is determined by resonance between a capacitance component of the parallel arm resonators 320 to 322 and the inductors 330 and 331. The capacitance component of the parallel arm resonators 320 to 322 is determined by an inter-electrode distance of the IDT electrode. Therefore, when the inter-electrode distance of the IDT electrode changes due to distortion of the mounting substrate, the capacitance of the parallel arm resonators 320 to 322 may be changed, and predetermined attenuation characteristics are not able to be provided.

Accordingly, when the ladder filter 300 as shown in FIG. 16 is provided in the acoustic wave device, the parallel arm resonators 320 to 322 are provided in the improvement region shown in FIGS. 15A and 15B. Therefore, the change in the capacitance caused by the distortion in the reflow process is able to be significantly reduced or prevented, and thus a decrease in the attenuation characteristics is able to significantly reduced or prevented.

Note that the circuitry of the ladder filter 300 shown in FIG. 16 is an example, and a ladder filter including different circuitry, in which the number of serial arm resonators or the electrical connection(s) of the parallel arm resonators is different therefrom, may be provided.

Third Preferred Embodiment

In a third preferred embodiment of the present invention, an example in a case where the acoustic wave device includes a longitudinally coupled filter will be described.

Figure 17:
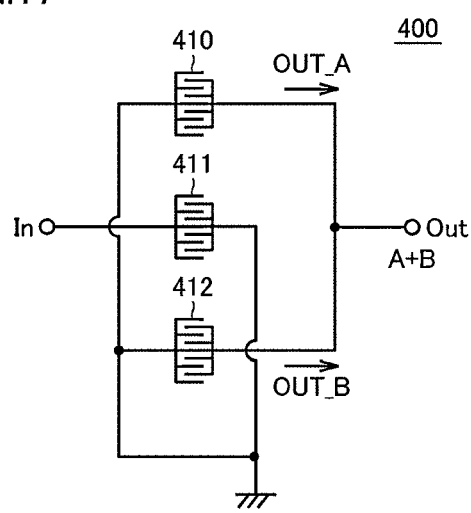
FIG. 17 is a diagram showing an example of a longitudinally coupled-type filter according to a third preferred embodiment of the present invention.

FIG. 17 is a diagram showing an example of a longitudinally coupled filter 400 according to the third preferred embodiment. Referring to FIG. 17, the longitudinally coupled filter 400 includes an acoustic wave resonator (input side resonator) 411 electrically connected between an input terminal In and a ground node, and acoustic wave resonators (output side resonators) 410 and 412 electrically connected in parallel between an output terminal Out and the ground node. The output side resonators 410 and 412 are respectively located at positions equidistant from the input side resonator 411 in an excitation direction of the input side resonator 411.

In the longitudinally coupled filter 400, a high-frequency signal input to the input terminal In causes resonance at the input side resonator 411, the vibration thereof is transmitted to the output side resonators 410 and 412, and output from the output terminal Out. At this time, the signal output from the output terminal Out becomes a signal (A+B) determined by adding together an output signal OUT_A output from the output side resonator 410 and an output signal OUT_B output from the output side resonator 412. In order to output a correct signal from the output terminal Out, phases of the output signal OUT_A and the output signal OUT_B are matched with one another.

In general, in order to provide the output signal OUT_A and the output signal OUT_B with the same or substantially the same phase, the distance between the input side resonator 411 and the output side resonator 410 is designed to be the same or substantially the same as the distance between the input side resonator 411 and the output side resonator 412. However, when the piezoelectric substrate is deformed in the reflow process, the distances between the input side resonator 411 and the output side resonators 410 and 412 differ from each other, and a phase difference may be generated between the output signal OUT_A and the output signal OUT_B.

Figure 18:
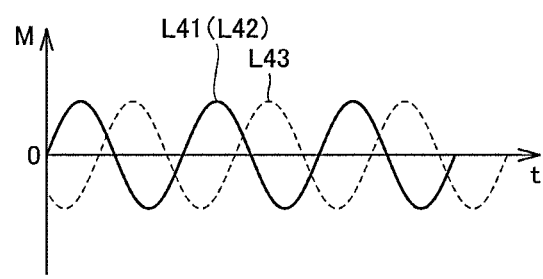
FIG. 18 is a diagram showing influence of distortion of an acoustic wave resonator in the longitudinally coupled-type filter.

FIG. 18 is a diagram showing the influence of distortion of the acoustic wave resonator in the longitudinally coupled-type filter 400. In FIG. 18, the horizontal axis represents time, and the vertical axis represents an amplitude (intensity) of the output signal. When the solid line L41 is taken as the output signal OUT_A, when the output signal OUT_B has the same or substantially the same phase, the output signal OUT_B has a waveform overlapping with the solid line L41 (L42). At this time, a composite signal becomes a signal having a doubled amplitude.

On the other hand, when the output signal OUT_B has a phase difference with respect to the output signal OUT_A as indicated by the broken line L43, the composite signal has a waveform different from that in the case where the two output signals has the same or substantially the same phase. For example, when the phase difference becomes about 180°, the output signal OUT_A and the output signal OUT_B interfere with each other, and no output signal is output from the output terminal Out.

Therefore, when the acoustic wave device includes the longitudinally coupled filter 400 as shown in FIG. 17, the acoustic wave resonators (the input side resonator and the output side resonators) included in the longitudinally coupled filter 400 are located in the improvement region shown in FIGS. 15A and 15B. Accordingly the phase difference generated between the output signal OUT_A and the output signal OUT_B due to the distortion in the reflow process is able to be significantly reduced or prevented.

Note that the circuitry of the longitudinally coupled filter 400 shown in FIG. 17 is an example, and a longitudinally coupled filter including different circuitry may be provided.

Fourth Preferred Embodiment

In a fourth preferred embodiment of the present invention, an example will be described in which deterioration in a pass frequency band is significantly reduced or prevented in a case where the acoustic wave device is a ladder filter.

Figure 19:
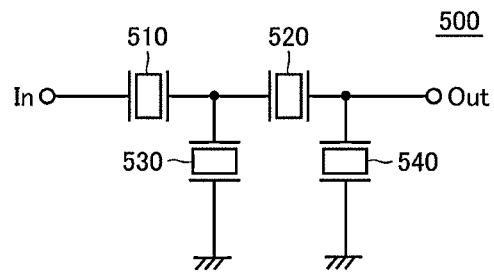
FIG. 19 is a diagram showing an example of a ladder filter according to a fourth preferred embodiment of the present invention.

FIG. 19 is a diagram showing a ladder filter 500 according to the fourth preferred embodiment. Referring to FIG. 19, the ladder filter 500 includes serial arm resonators 510 and 520 electrically connected in series between an input terminal In and an output terminal Out, and parallel arm resonators 530 and 540 each electrically connected between the serial arm and a ground node.

One end of the serial arm resonator 510 is electrically connected to the input terminal In, and the other end thereof is electrically connected to one end of the serial arm resonator 520. The other end of the serial arm resonator 520 is electrically connected to the output terminal Out. The parallel arm resonator 530 is electrically connected between a connection node between the serial arm resonator 510 and the serial arm resonator 520 and the ground node. The parallel arm resonator 540 is electrically connected between the output terminal Out and the ground node.

In the ladder filter 500 as described above, a pass band is generally determined by setting an attenuation pole of each of the acoustic wave resonators. More specifically, when a band pass filter is defined by the ladder filter 500, the lower limit of the pass band is determined by impedance characteristics (resonant frequency) of the parallel arm resonator, and the upper limit of the pass band is determined by impedance characteristics (anti-resonant frequency) of the serial arm resonator.

Figure 20:
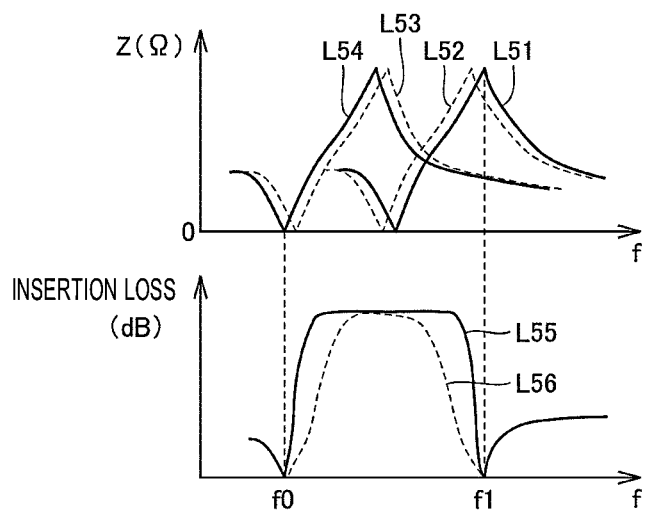
FIG. 20 includes diagrams showing influence of distortion of an acoustic wave resonator on frequency characteristics of the filter.

FIG. 20 includes diagrams respectively showing examples of frequency characteristics of an impedance Z (diagram on the upper side) and an insertion loss (diagram on the lower side) of each of the acoustic wave resonators in the ladder filter 500. Referring to FIG. 20, in the diagram on the upper side, the solid line L51 indicates the impedance characteristics of the serial arm resonator 510, and the broken line L52 indicates the impedance characteristics of the serial arm resonator 520. Furthermore, the broken line L53 indicates the impedance characteristics of the parallel arm resonator 530, and the solid line L54 indicates the impedance characteristics of the parallel arm resonator 540.

In the parallel arm resonator, the impedance Z of the parallel arm resonator is reduced or minimized at a resonant frequency (f0 in FIG. 20), a signal input from the input terminal In at this time passes through the parallel arm resonator and is transmitted to the ground node, and is not transmitted to the output terminal Out. Therefore, at the resonant frequency of the parallel arm resonator, the insertion loss increases.

In the serial arm resonator, in contrast to the parallel arm resonator, the impedance Z decreases at the resonant frequency, and thus a signal is transmitted from the input terminal In to the output terminal Out. On the other hand, in the anti-resonant frequency (f1 in FIG. 20) where the impedance Z increases, no signal is transmitted to the output terminal Out, and the insertion loss increases.

Accordingly, the lower limit of the pass band is determined by a resonator having the minimum resonant frequency among the parallel arm resonators, and the upper limit of the pass band is determined by a resonator having the maximum anti-resonant frequency among the serial arm resonators. In the example in FIG. 20, the lower limit f0 of the pass band is determined by the parallel arm resonator 540 (solid line L54), and the upper limit f1 of the pass band is determined by the serial arm resonator 510 (solid line L51). As a result, the range of f0 to f1 in frequency becomes the pass band of the signal.

The serial arm resonator 520 and the parallel arm resonator 530 do not directly define the upper and lower limits of the pass band, but attenuation steepness at the upper and lower limits of the pass band is affected by the resonant frequency and the anti-resonant frequency thereof. Specifically, the closer the resonant frequencies of the parallel arm resonators are to each other, the steeper the attenuation on the lower limit side becomes. Furthermore, the closer the anti-resonant frequencies of the serial arm resonators are to each other, the steeper the attenuation on the upper limit side becomes.

Here, when the distortion is generated in the mounting substrate during the reflow and the IDT electrode of the acoustic wave resonator is deformed, the capacitance, the inductance, pitch of the IDT, and the acoustic velocity the acoustic wave of the acoustic wave resonator may change. As a result, since the resonant frequency and the anti-resonant frequency of each acoustic wave resonator vary from design values, a desired pass band width may not be provided. In addition, when a shift amount between the resonant frequencies of the parallel arm resonators or between the anti-resonant frequencies of the serial arm resonators increases, the attenuation steepness in a vicinity of the upper or lower limit of the pass band width deteriorates, and there is a risk that defective characteristics in a vicinity of the upper or lower limit occur (the broken line L56 in FIG. 20).

Accordingly, in a case where the acoustic wave device has a ladder filter as shown in FIG. 19, at least one of a resonator having the lowest resonant frequency among the parallel arm resonators and a resonator having the highest anti-resonant frequency among the serial arm resonators is located in the improvement region shown in FIGS. 15A and 15B. Therefore, deterioration in the attenuation steepness caused by the distortion in the reflow process is able to significantly reduced or prevented, and thus deterioration in the characteristics of the ladder filter is able to significantly reduced or prevented.

Note that in a case where the ladder filter defines a band pass filter, both the serial arm resonator defining the upper limit frequency and the parallel arm resonator defining the lower limit frequency are preferably provided in the improvement region, for example.

Note that the circuitry of the ladder filter is not limited to that shown in FIG. 19, and may be replaced by the circuitry shown in FIG. 16 in the second preferred embodiment, for example. In the case of including the circuitry in FIG. 16 as well, by applying the fourth preferred embodiment, deterioration in the characteristics is able to significantly reduced or prevented by providing an acoustic wave resonator defining the upper limit frequency and/or an acoustic wave resonator defining the lower limit frequency of the pass band in the improvement region.

Fifth Preferred Embodiment

In a fifth preferred embodiment of the present invention, an example will be described in which, in a multiplexer to transmit and receive a high-frequency signal through an antenna, an Intermodulation Distribution (IMD) is reduced. In general, in a multiplexer, a transmission filter and a reception filter electrically connected to a common antenna are included.

The transmission filter is electrically connected between the antenna and a transmission terminal, extracts a signal having a predetermined band width from a high-frequency signal transmitted from a control circuit to the transmission terminal, and transmits the extracted signal through the antenna. The reception filter extracts a signal having a predetermined band width from a high-frequency signal received through the antenna, and outputs the extracted signal to the control circuit through a reception terminal.

The transmission filter is preferably, for example, a ladder filter including a serial arm resonator that defines a serial arm and a parallel arm resonator that defines a parallel arm.

The reception filter includes, for example, a ladder filter and a longitudinally coupled filter.

In the transmission filter of the multiplexer as described above, a transmission signal is amplified in the control circuit (not shown), and a radio wave is able to be emitted by a predetermined distance from the antenna. Therefore, the transmission signal is a high-frequency signal having relatively large power (amplitude) through the serial arm resonator as compared to the reception signal. Furthermore, the transmission signal has a pass band frequency of the transmission filter, and is thus transmitted to the antenna with almost no attenuation.

In the multiplexer, noise received through the antenna (a frequency other than those of the transmission and reception pass band) is transmitted not only to the reception filter, but also to the transmission filter. The signal transmitted to the transmission filter has a frequency other than those of the pass band, and is gradually attenuated every time the signal passes through the serial arm resonators. Therefore, since the two signals of the transmission signal and the noise are simultaneously input to a serial arm resonator closest to the antenna side among the serial arm resonators, a larger stress is applied thereto than to the other serial arm resonators.

Figure 21:
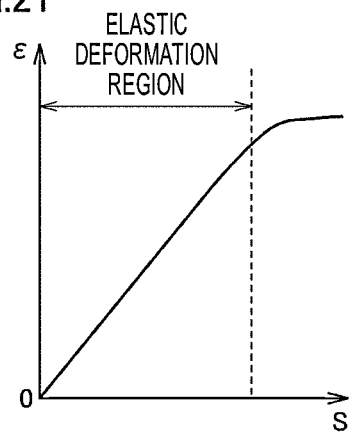
FIG. 21 is a diagram showing a relationship between stress and distortion in the acoustic wave resonator.
Figure 22:
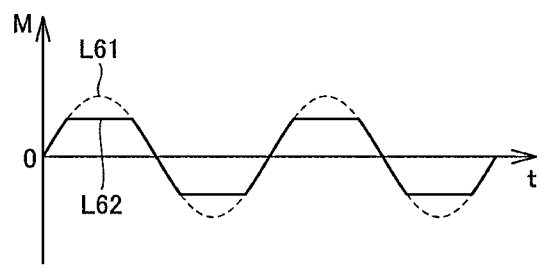
FIG. 22 is a diagram showing influence in a case where the acoustic wave resonator is included in a non-linear region.

The acoustic wave resonator converts electrical vibration into mechanical vibration and transmits the resulting vibration, and converts the transmitted mechanical vibration into electrical vibration again. Therefore, nonlinear mechanical vibration being generated causes appearance of electrical distortion. In the acoustic wave devices 100 and 100A as shown in FIG. 5 or FIG. 6, the piezoelectric substrate that transmits the mechanical vibration generally has stress-distortion characteristics as shown in FIG. 21. Therefore, when the mechanical vibration is performed in an elastic deformation region, linear mechanical vibration is provided, but when distortion occurs in the piezoelectric substrate due to deformation during the reflow process, the mechanical vibration at the time of signal transmission is performed in a region beyond the elastic deformation region, and nonlinear mechanical vibration is easy to be generated. As a result, for example, as indicated by a solid line L62 in FIG. 22, the waveform is distorted, and the amplitude is limited as compared to the signal waveform (broken line L61) at the normal time, and deterioration in the characteristics of the filter may occur.

In the multiplexer, as described above, in the transmission filter, the acoustic wave resonator electrically connected closest to the antenna is subjected to a larger stress than the other acoustic wave resonators, and the distortion characteristics are likely to be deteriorated.

In order to reduce the distortion as described above, a method in which the corresponding acoustic wave resonator is divided may be employed. However, dividing the acoustic wave resonator increases a substrate area to mount the acoustic wave resonator, which may prevent a reduction in size. Therefore, in the fifth preferred embodiment, by designing the serial arm resonator electrically connected closest to the antenna to be located in the improvement region in FIGS. 15A and 15B, the distortion of the piezoelectric substrate during the reflow process is reduced, and the mechanical vibration performed in the non-linear region is significantly reduced or prevented. Accordingly, deterioration in the distortion characteristics in the multiplexer is able to be significantly reduced or prevented.

In the description of each of the first to fifth preferred embodiments, examples where the SAW is provided as the acoustic wave device have been described, but the preferred embodiments described above may be applied even when the BAW shown in FIG. 7 (FBAR) and FIG. 8 (SMR) is provided as the acoustic wave device. Furthermore, the preferred embodiments may be applied to an acoustic wave device in which the SAW and the BAW are mixed.

Furthermore, in the above description, the case where both of the two devices provided on the mounting substrate are the acoustic wave devices has been described as an example, but even in a case where one device is a device other than the acoustic wave device (for example, a power amplifier, a semiconductor, or the like), the same or similar advantageous effects and features are able to be provided by setting the relationship between the coefficients of linear expansion of the substrate included in the device and the piezoelectric substrate of the acoustic wave device and the coefficient of linear expansion of the mounting substrate as described above.

The preferred embodiments described herein are illustrative in all respects and are not restrictive. The scope of the present invention is indicated by the scope of the claims rather than the description of the above-described preferred embodiments, and it is intended to include all modifications within the meaning and scope equivalent to the scope of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency apparatus comprising:
   a resin substrate;
   a first device including a substrate and provided on the resin substrate; and
   a second device provided adjacent to the first device on the resin substrate; wherein
   each of the first device and the second device includes an acoustic wave device;
   the second device includes:
   a piezoelectric substrate; and
   a functional element provided on the piezoelectric substrate;
   the substrate of the first device includes Si or a laminated material including Si;
   the piezoelectric substrate of the second device includes $LiTaO_3$, $LiNbO_3$, or a laminated material including $LiTaO_3$ or $LiNbO_3$; and
   the resin substrate includes glass.

2. The high-frequency apparatus according to claim 1, wherein the substrate of the first device is made of Si.

3. The high-frequency apparatus according to claim 2, wherein the first device is a bulk acoustic wave resonator.

4. The high-frequency apparatus according to claim 1, wherein the piezoelectric substrate of the second device is made of $LiNbO_3$.

5. The high-frequency apparatus according to claim 2, wherein the first device is a surface acoustic wave resonator.

6. The high-frequency apparatus according to claim 1, wherein a shortest distance between the first and second devices is less than a width of the first device or a minimum width of the second device.

7. The high-frequency apparatus according to claim 1, wherein in a plan view, the first and second devices each have a rectangular shape and a longer side of the first device is adjacent to a longer side of the second device.

8. The high-frequency apparatus according to claim 1, wherein a resin material of the resin substrate includes epoxy or phenol.

9. The high-frequency apparatus according to claim 1, wherein a height of the first device is the same or substantially the same as a height of the second device.

10. The high-frequency apparatus according to claim 1, wherein each of the first and second devices includes a support portion and cover portion.

11. The high-frequency apparatus according to claim 10, wherein the cover portion of the first device is Si.

12. The high-frequency apparatus according to claim 10, wherein the cover portion of the first device is resin.

13. The high-frequency apparatus according to claim 10, wherein
   the substrate of the first device is thicker than the cover portion of the first device; and
   the piezoelectric substrate of the second device is thicker than the cover portion of the second device.

14. The high-frequency apparatus according to claim 1, wherein
   in the second device, a ladder filter including a serial arm resonator, a parallel arm resonator, and an inductor electrically connected in series or in parallel to the parallel arm resonator is provided; and
   the parallel arm resonator is provided between adjacent sides adjacent to each other of the first device and the second device adjacent to each other and an imaginary line that passes through a center of the second device and is parallel or substantially parallel to the adjacent sides.

15. The high-frequency apparatus according to claim 1, wherein
   in the second device, a ladder filter including serial arm resonators, parallel arm resonators, and an inductor electrically connected in series or in parallel to the parallel arm resonators is provided; and
   at least one of a resonator which defines an upper limit frequency of a pass band of the filter among the serial arm resonators, and a resonator which defines a lower limit frequency of the pass band of the filter among the parallel arm resonators is provided between adjacent sides adjacent to each other of the first device and the second device adjacent to each other and an imaginary line that passes through a center of the second device and is parallel or substantially parallel to the adjacent sides.

16. The high-frequency apparatus according to claim 1, wherein
   a plurality of the functional elements are provided on a main surface of the piezoelectric substrate; and
   the second device further includes:
   a support portion provided in a periphery of a region in which the plurality of functional elements is provided; and
   a cover portion that faces a main surface of the piezoelectric substrate.

17. The high-frequency apparatus according to claim 16, wherein a via is provided through the support portion, and the via is electrically connected to a wiring pattern provided on a main surface of the piezoelectric substrate.

18. The high-frequency apparatus according to claim 1, wherein a wiring pattern provided on a main surface of the piezoelectric substrate is electrically connected to a wiring pattern provided on a surface of the resin substrate by a conductive portion.

19. The high-frequency apparatus according to claim 1, wherein a coefficient of linear expansion of the piezoelectric substrate of the second device is about 16 ppm/° C. and a coefficient of linear expansion of the resin substrate is between about 8 ppm/° C. and about 14 ppm/° C.

20. The high-frequency apparatus according to claim 1, wherein the first device is an FBAR (Film Bulk Acoustic Resonator) bulk acoustic wave resonator.

21. The high-frequency apparatus according to claim 1, wherein the second device includes a longitudinally coupled filter including a plurality of acoustic wave resonators.

22. The high-frequency apparatus according to claim 1, wherein
in the second device, a ladder filter including a serial arm resonator and a parallel arm resonator is provided; and
the parallel arm resonator is provided between adjacent sides adjacent to each other of the first device and the second device adjacent to each other and an imaginary line that passes through a center of the second device and is parallel or substantially parallel to the adjacent sides.

23. The high-frequency apparatus according to claim 1, wherein
in the second device, a ladder filter including serial arm resonators and parallel arm resonators is provided; and
at least one of a resonator which defines an upper limit frequency of a pass band of the filter among the serial arm resonators, and a resonator which defines a lower limit frequency of the pass band of the filter among the parallel arm resonators is provided between adjacent sides adjacent to each other of the first device and the second device adjacent to each other and an imaginary line that passes through a center of the second device and is parallel or substantially parallel to the adjacent sides.

* * * * *